(12) United States Patent
Zhu et al.

(10) Patent No.: US 10,153,755 B2
(45) Date of Patent: Dec. 11, 2018

(54) SIGNAL RECEIVER, RELATED METHOD, AND RELATED ELECTRONIC DEVICE

(71) Applicants: Semiconductor Manufacturing International (Shanghai) Corporation, Shanghai (CN); Semiconductor Manufacturing International (Beijing) Corporation, Beijing (CN)

(72) Inventors: Kai Zhu, Shanghai (CN); Jie Chen, Shanghai (CN)

(73) Assignees: SEMICONDUCTOR MANUFACTURING INTERNATIONAL (SHANGHAI) CORPORATION (CN); SEMICONDUCTOR MANUFACTURING INTERNATIONAL (BEIJING) CORPORATION (CN)

( * ) Notice: Subject to any disclaimer, the term of this patent is extended or adjusted under 35 U.S.C. 154(b) by 27 days.

(21) Appl. No.: 15/298,811

(22) Filed: Oct. 20, 2016

(65) Prior Publication Data

US 2017/0201242 A1    Jul. 13, 2017

(30) Foreign Application Priority Data

Jan. 12, 2016 (CN) .......................... 2016 1 0016990

(51) Int. Cl.
*H03L 5/00* (2006.01)
*H03K 5/08* (2006.01)
(Continued)

(52) U.S. Cl.
CPC ................. *H03K 5/08* (2013.01); *G05F 3/24* (2013.01); *H03K 19/0027* (2013.01); *H03K 19/018585* (2013.01)

(58) Field of Classification Search
CPC ............ H03K 5/01; H03K 5/08; H03K 5/082; H03K 5/084; H03K 5/086; H03K 5/088;
(Continued)

(56) References Cited

U.S. PATENT DOCUMENTS 6,147,540 A   11/2000  Coddington
7,173,472 B2   2/2007  Chen et al.
(Continued)

OTHER PUBLICATIONS

EP Search Report corresponding to European Patent Application No. 16207481.9, dated Jun. 23, 2017, 9 pages.

*Primary Examiner* — Lincoln Donovan
*Assistant Examiner* — Diana J Cheng
(74) *Attorney, Agent, or Firm* — Innovation Counsel LLP

(57) ABSTRACT

A signal receiver may include the following elements: a first transmission gate connected to an signal input terminal and receiving a first reference voltage; a enable switch connected to a first power supply terminal and receiving a first enable signal; a p-channel transistor connected to the enable switch and the first transmission gate; a first protection switch connected to the p-channel transistor and receiving the first reference voltage; a second transmission gate connected to the signal input terminal and receiving a second reference voltage; an n-channel transistor connected to a second power supply terminal, an signal output terminal, and the second transmission gate; a second protection switch connected to the signal output terminal, the n-channel transistor, and the first protection switch and receiving the second reference voltage; and a pull-down transistor connected to the second power supply terminal, the n-channel transistor, and the output terminal and receiving a second enable signal.

15 Claims, 3 Drawing Sheets

(51) Int. Cl.
*G05F 3/24* (2006.01)
*H03K 19/00* (2006.01)
*H03K 19/0185* (2006.01)

(58) Field of Classification Search
CPC ........... H03K 19/0021; H03K 19/0024; H03K 19/0027; H03K 19/0175; H03K 19/0185; H03K 19/018585; G05F 3/24; G05F 3/242; G05F 3/245; G05F 3/247
USPC ....... 327/306, 309–310, 312, 316, 318, 321, 327/323, 327–328, 332
See application file for complete search history.

(56) References Cited

U.S. PATENT DOCUMENTS

| | | |
|---|---|---|
| 2005/0286333 A1 | 12/2005 | Gupta et al. |
| 2013/0141140 A1 | 6/2013 | Kumar |

SIGNAL RECEIVER, RELATED METHOD, AND RELATED ELECTRONIC DEVICE

CROSS-REFERENCE TO RELATED APPLICATION

This application claims priority to and benefit of Chinese Patent Application No. 201610016990.7, filed on 12 Jan. 2016; the Chinese Patent Application is incorporated herein by reference in its entirety.

BACKGROUND OF THE INVENTION

The technical field is related to a signal receiver, a method of operating the signal receiver, and an electronic device that includes the signal receiver.

A signal receiver may be included in an electronic device for receiving input signals from an external source and for outputting output signals to another component of the electronic device. The signal receiver may include transistors for performing various operations. The transistors may have substantially thin gate oxide layers, such that operation speeds of the transistors may be maximized. Nevertheless, the gate oxide layers may be too thin to tolerate high electric field stress. Therefore, the signal receiver may have reliability issues in high-voltage applications and/or applications of the electronic device may be substantially limited.

SUMMARY

An embodiment may be related to a signal receiver. The signal receiver may include the following elements: a signal input terminal, which may be configured to receive an input signal; a first power supply terminal, which may be configured to receive a first power supply voltage; a second power supply terminal, which may be configured to receive a second power supply voltage; a signal output terminal, which may be configured to output an output signal; a first transmission gate, wherein a first terminal of the first transmission gate may be electrically connected to the signal input terminal, and wherein a control electrode of the first transmission gate may be configured to receive a first copy of a first reference voltage; an enable switch, wherein a first terminal of the enable switch may be electrically connected to the first power supply terminal, and wherein a control electrode of the enable switch may be configured to receive a first enable signal; a first p-channel transistor, wherein a first terminal of the first p-channel transistor may be electrically connected to a second terminal of the enable switch, and wherein a gate electrode of the first p-channel transistor may be electrically connected to a second terminal of the first transmission gate; a first protection switch, wherein a first terminal of the first protection switch may be electrically connected to a second terminal of the first p-channel transistor, and wherein a control electrode of the first protection switch may be configured to receive a second copy of the first reference voltage; a second transmission gate, wherein a first terminal of the second transmission gate may be electrically connected to the signal input terminal, and wherein a control electrode of the second transmission gate may be configured to receive a first copy of a second reference voltage; a first n-channel transistor, wherein a first terminal of the first n-channel transistor may be electrically connected to the second power supply terminal, and wherein a second terminal of the first n-channel transistor may be electrically connected to the signal output terminal, and wherein a gate electrode of the first n-channel transistor may be electrically connected to a second terminal of the second transmission gate; a second protection switch, wherein a first terminal of the second protection switch may be electrically connected to each of the signal output terminal and the second terminal of the first n-channel transistor, wherein a second terminal of the second protection switch may be electrically connected to a second terminal of the first protection switch, and wherein a control electrode of the second protection switch may be configured to receive a second copy of the second reference voltage; and a pull-down transistor, wherein a first terminal of the pull-down transistor may be electrically connected to each of the second power supply terminal and the first terminal of the first n-channel transistor, wherein a second terminal of the pull-down transistor may be electrically connected to each of the signal output terminal and the second terminal of the first n-channel transistor, and wherein a gate electrode of the pull-down transistor may be configured to receive a second enable signal.

The first power supply terminal and the second power terminal may provide a first power voltage difference. One or more of a maximum allowable voltage of the first transmission gate, a maximum allowable voltage of the enable switch, a maximum allowable voltage of the first p-channel transistor, a maximum allowable voltage of the first protection switch, a maximum allowable voltage of the second transmission gate, a maximum allowable voltage of the first n-channel transistor, a maximum allowable voltage of the second protection switch, and a maximum allowable voltage of the pull-down switch may be less than the first power voltage difference.

The signal receiver may include an enable signal generator, which may be configured to generate the first enable signal and the second enable signal. The first enable signal may be at a first level if the second enable signal is at a second level. The first enable signal may be at a third level if the second enable signal is at a fourth level. The first level may be higher than the third level. The second level may be higher than the fourth level.

The signal receiver may include an enable signal generator, which may include a differential amplifier and may be configured to generate the first enable signal and the second enable signal. The differential amplifier may include a first input terminal and a second input terminal. The first input terminal may receive an inverted copy of a control signal. The second input terminal may receive a copy (e.g., a twice inverted copy) of the control signal.

The signal receiver may include the following elements: a first enable signal node, which may be configured to provide the first enable signal; a second n-channel transistor, wherein a first terminal of the second n-channel transistor may be electrically connected to the second power supply terminal, and wherein a gate electrode of the second n-channel transistor may be configured to receive an inverted copy of a control signal; a second p-channel transistor, wherein a first terminal of the second p-channel transistor may be electrically connected to the first power supply terminal, wherein a second terminal of the second p-channel transistor may be electrically connected to a second terminal of the second n-channel transistor, and wherein a gate electrode of the second p-channel transistor may be electrically connected to the first enable signal node; a third n-channel transistor, wherein a first terminal of the third n-channel transistor may be electrically connected to the second power supply terminal, wherein a second terminal of the third n-channel transistor may be electrically connected through the first enable signal node to the gate electrode of the second p-channel transistor, and wherein a gate electrode of the third n-channel transistor may be configured to receive a copy of the control signal; and a third p-channel transistor, wherein a first terminal of the third p-channel transistor may be electrically connected to the first power supply terminal, wherein a second terminal of the third p-channel transistor may be electrically connected through the first enable signal node to the second terminal of the third n-channel transistor, and wherein a gate electrode of the third p-channel transistor may be electrically connected to each of the second terminal of the second n-channel transistor and the second terminal of the second p-channel transistor.

The signal receiver may include a third protection switch, wherein a first terminal of the third protection switch may be electrically connected to the second terminal of the second n-channel transistor, wherein a second terminal of the third protection switch may be electrically connected to the second terminal of the second p-channel transistor, and wherein a control electrode of the third protection switch may be configured to receive a third copy of the second reference signal.

The signal receiver may include a fourth protection switch, wherein a first terminal of the fourth protection switch may be electrically connected to the second terminal of the third protection switch, wherein a second terminal of the fourth protection switch may be electrically connected to the second terminal of the second p-channel transistor, and wherein a control electrode of the fourth protection switch may be configured to receive a third copy of the first reference signal.

The signal receiver may include a fifth protection switch, wherein a first terminal of the fifth protection switch may be electrically connected to the second terminal of the third n-channel transistor, wherein a second terminal of the fifth protection switch may be electrically connected through the first enable signal node to the second terminal of the third p-channel transistor, and wherein a control electrode of the fifth protection switch may be configured to receive a fourth copy of the second reference signal.

The signal receiver may include a sixth protection switch, wherein a first terminal of the sixth protection switch may be electrically connected to the second terminal of the third n-channel transistor, wherein a second terminal of the sixth protection switch may be electrically connected through the first enable signal node to the second terminal of the third p-channel transistor, and wherein a control electrode of the sixth protection switch may be configured to receive a fourth copy of the first reference signal.

The signal receiver may include an inverter or a plurality of inverters. The inverters may be cascaded. An input node of the inverter or an input node of the plurality of inverters may be electrically connected to the signal output terminal.

An embodiment may be related to a method of operating a signal receiver. The method may include the following steps: providing an input signal to a signal input terminal of the signal receiver; providing a first power supply voltage to a first power supply terminal of the signal receiver; providing a second power supply voltage to a second power supply terminal of the signal receiver; using a signal output terminal of the signal receiver to provide an output signal; providing a first copy of a first reference voltage to a control electrode of a first transmission gate of the signal receiver, wherein a first terminal of the first transmission gate may be electrically connected to the signal input terminal; providing a first enable signal to a control electrode of an enable switch of the signal receiver, wherein a first terminal of the enable switch may be electrically connected to the first power supply terminal, wherein a first terminal of a first p-channel transistor of the signal receiver may be electrically connected to a second terminal of the enable switch, and wherein a gate electrode of the first p-channel transistor may be electrically connected to a second terminal of the first transmission gate; providing a second copy of the first reference voltage to a control electrode of a first protection switch of the signal receiver, wherein a first terminal of the first protection switch may be electrically connected to a second terminal of the first p-channel transistor; providing a first copy of a second reference voltage to a control electrode of a second transmission gate of the signal receiver, wherein a first terminal of the second transmission gate may be electrically connected to the signal input terminal, wherein a first terminal of a first n-channel transistor of the signal receiver may be electrically connected to the second power supply terminal, wherein a second terminal of the first n-channel transistor may be electrically connected to the signal output terminal, and wherein a gate electrode of the first n-channel transistor may be electrically connected to a second terminal of the second transmission gate; providing a second copy of the second reference voltage to a control electrode of a second protection switch of the signal receiver, wherein a first terminal of the second protection switch may be electrically connected to each of the signal output terminal and the second terminal of the first n-channel transistor, and wherein a second terminal of the second protection switch may be electrically connected to a second terminal of the first protection switch; and providing a second enable signal to a gate electrode of a pull-down transistor of the signal receiver, wherein a first terminal of the pull-down transistor may be electrically connected to each of the second power supply terminal and the first terminal of the first n-channel transistor, and wherein a second terminal of the pull-down transistor may be electrically connected to each of the signal output terminal and the second terminal of the first n-channel transistor.

The method may include providing a first power voltage difference between the first power supply terminal and the second power terminal. The power voltage difference may be higher than one or more of a maximum allowable voltage of the first transmission gate, a maximum allowable voltage of the enable switch, a maximum allowable voltage of the first p-channel transistor, a maximum allowable voltage of the first protection switch, a maximum allowable voltage of the second transmission gate, a maximum allowable voltage of the first n-channel transistor, a maximum allowable voltage of the second protection switch, and a maximum allowable voltage of the pull-down switch.

The first enable signal may be at a first level if the second enable signal is at a second level. The first enable signal may be at a third level if the second enable signal is at a fourth level. The first level may be higher than the third level. The second level may be higher than the fourth level.

An embodiment may be related to an electronic device. The electronic device may include the following elements: a signal input terminal, which may be configured to receive an input signal; a first power supply terminal, which may be configured to receive a first power supply voltage; a second power supply terminal, which may be configured to receive a second power supply voltage; a signal output terminal, which may be configured to output an output signal; a first transmission gate, wherein a first terminal of the first transmission gate may be electrically connected to the signal input terminal, and wherein a control electrode of the first transmission gate may be configured to receive a first copy of a first reference voltage; an enable switch, wherein a first terminal of the enable switch may be electrically connected to the first power supply terminal, and wherein a control electrode of the enable switch may be configured to receive a first enable signal; a first p-channel transistor, wherein a first terminal of the first p-channel transistor may be electrically connected to a second terminal of the enable switch, and wherein a gate electrode of the first p-channel transistor may be electrically connected to a second terminal of the first transmission gate; a first protection switch, wherein a first terminal of the first protection switch may be electrically connected to a second terminal of the first p-channel transistor, and wherein a control electrode of the first protection switch may be configured to receive a second copy of the first reference voltage; a second transmission gate, wherein a first terminal of the second transmission gate may be electrically connected to the signal input terminal, and wherein a control electrode of the second transmission gate may be configured to receive a first copy of a second reference voltage; a first n-channel transistor, wherein a first terminal of the first n-channel transistor may be electrically connected to the second power supply terminal, wherein a second terminal of the first n-channel transistor may be electrically connected to the signal output terminal, and wherein a gate electrode of the first n-channel transistor may be electrically connected to a second terminal of the second transmission gate; a second protection switch, wherein a first terminal of the second protection switch may be electrically connected to each of the signal output terminal and the second terminal of the first n-channel transistor, wherein a second terminal of the second protection switch may be electrically connected to a second terminal of the first protection switch, and wherein a control electrode of the second protection switch may be configured to receive a second copy of the second reference voltage; a pull-down transistor, wherein a first terminal of the pull-down transistor may be electrically connected to each of the second power supply terminal and the first terminal of the first n-channel transistor, wherein a second terminal of the pull-down transistor may be electrically connected to each of the signal output terminal and the second terminal of the first n-channel transistor, and wherein a gate electrode of the pull-down transistor may be configured to receive a second enable signal; an enable signal generator, which may include a differential amplifier and may be configured to generate the first enable signal and the second enable signal, wherein the differential amplifier may include a first input terminal and a second input terminal, wherein the first input terminal may receive an inverted copy of a control signal, and wherein the second input terminal may receive a copy of the control signal; and a core circuit, which may be configured to provide the control signal and may be configured to receive one or more of the output signal and an adjusted signal generated based on the output signal.

The electronic device may include a plurality of inverters, which may be configured to receive the output signal and may be configured to provide the adjusted signal. The inverters may be cascaded and may include a first inverter and a second inverter. The first inverter may be configured to receive the output signal from the signal output terminal. The second inverter may be configured to provide the adjusted signal to the core circuit.

According to embodiments, components (e.g., transistors) in a signal receiver may be sufficiently protected, such that the signal receiver may reliably operate with a high power supply voltage and/or a high input signal voltage. Advantageously, an electronic device that includes the signal receiver may have satisfactory performance and/or may have a wide range of applications. According to embodiments, the structure of the signal receiver may be substantially simple. Advantageously, cost associated with implementing the signal receiver may be satisfactorily low.

The above summary is related to some of many embodiments of the invention disclosed herein and is not intended to limit the scope of the invention.

DETAILED DESCRIPTION

Figure 1:
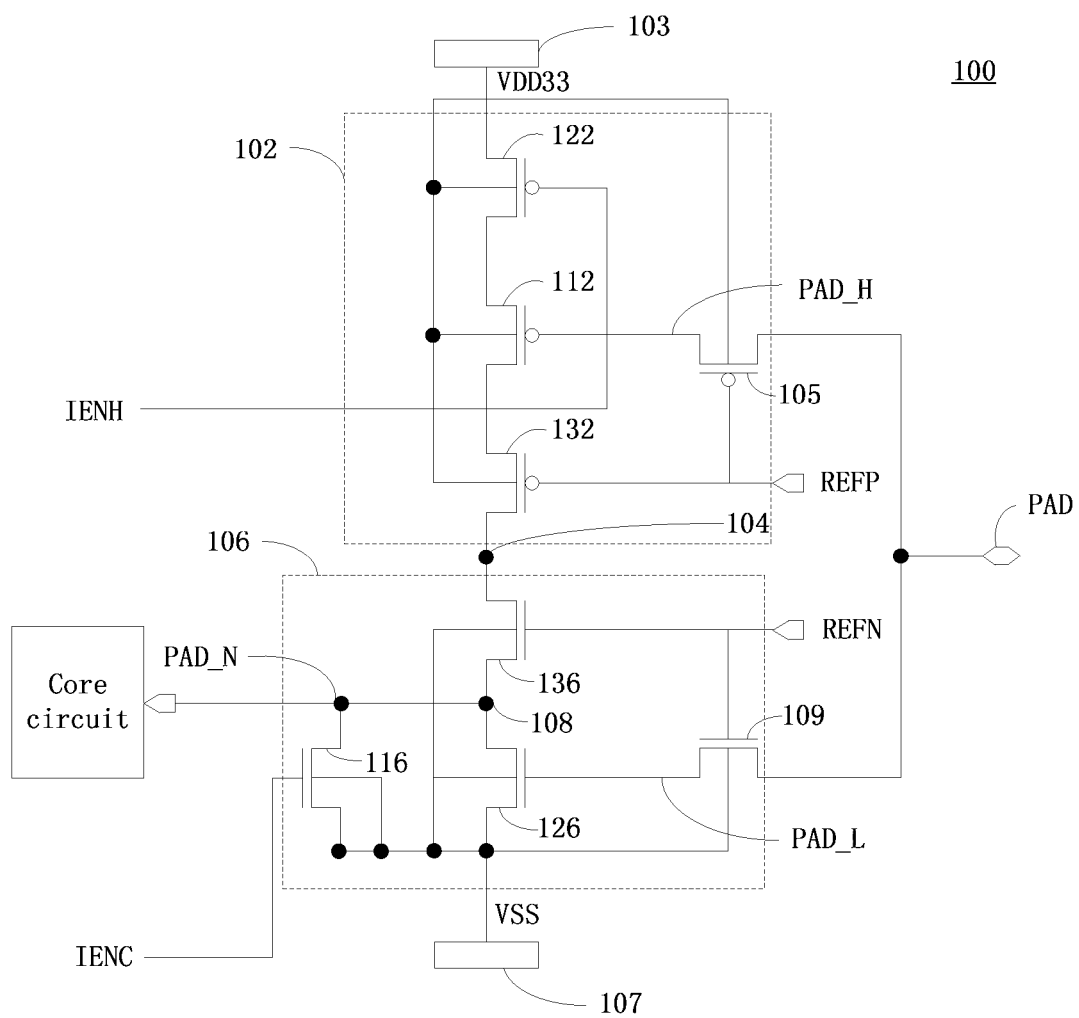
FIG. 1 shows a schematic diagram (e.g., a schematic circuit diagram) that illustrates elements and/or structures in a signal receiver in accordance with one or more embodiments.

Example embodiments are described with reference to the accompanying drawings. As those skilled in the art would realize, the described embodiments may be modified in various different ways, all without departing from the spirit or scope. Embodiments may be practiced without some or all of these specific details. Well known process steps and/or structures may not have been described in detail in order to not unnecessarily obscure described embodiments.

The drawings and description are illustrative and not restrictive. Like reference numerals may designate like (e.g., analogous or identical) elements in the specification. Repetition of description may be avoided.

The relative sizes and thicknesses of elements shown in the drawings are for facilitate description and understanding, without limiting possible embodiments. In the drawings, the thicknesses of some layers, films, panels, regions, etc., may be exaggerated for clarity.

Illustrations of example embodiments in the figures may represent idealized illustrations. Variations from the shapes illustrated in the illustrations, as a result of, for example, manufacturing techniques and/or tolerances, may be possible. Thus, the example embodiments should not be construed as limited to the shapes or regions illustrated herein but are to include deviations in the shapes. For example, an etched region illustrated as a rectangle may have rounded or curved features. The shapes and regions illustrated in the figures are illustrative and should not limit the scope of the example embodiments.

Although the terms "first", "second", etc. may be used herein to describe various elements, these elements should not be limited by these terms. These terms may be used to distinguish one element from another element. Thus, a first element discussed in this application may be termed a second element without departing from embodiments. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

If a first element (such as a layer, film, region, or substrate) is referred to as being "on", "neighboring", "connected to", or "coupled with" a second element, then the first element can be directly on, directly neighboring, directly connected to, or directly coupled with the second element, or an intervening element may also be present between the first element and the second element. If a first element is referred to as being "directly on", "directly neighboring", "directly connected to", or "directed coupled with" a second element, then no intended intervening element (except environmental elements such as air) may be provided between the first element and the second element.

Spatially relative terms, such as "beneath", "below", "lower", "above", "upper", and the like, may be used herein for ease of description to describe one element or feature's spatial relationship to another element(s) or feature(s) as illustrated in the figures. It will be understood that the spatially relative terms may encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein should be interpreted accordingly.

The terminology used herein is for the purpose of describing particular embodiments and is not intended to limit the embodiments. As used herein, the singular forms, "a", "an", and "the" may indicate plural forms as well, unless the context clearly indicates otherwise. The terms "includes" and/or "including", when used in this specification, may specify the presence of stated features, integers, steps, operations, elements, and/or components, but may not preclude the presence or addition of one or more other features, integers, steps, operations, elements, components, and/or groups.

Unless otherwise defined, terms (including technical and scientific terms) used herein have the same meanings as commonly understood by one of ordinary skill in the art. Terms, such as those defined in commonly used dictionaries, should be interpreted as having meanings that are consistent with their meanings in the context of the relevant art and should not be interpreted in an idealized or overly formal sense unless expressly so defined herein.

The term "connect" may mean "electrically connect", "directly connect", or "indirectly connect". The term "insulate" may mean "electrically insulate". The term "conductive" may mean "electrically conductive". The term "electrically connected" may mean "electrically connected without any intervening transistors". If a component (e.g., a transistor) is described as connected between a first element and a second element, then a source/drain/input/output terminal of the component may be electrically connected to the first element through no intervening transistors, and a drain/source/output/input terminal of the component may be electrically connected to the second element through no intervening transistors.

The term "conductor" may mean "electrically conductive member". The term "insulator" may mean "electrically insulating member". The term "dielectric" may mean "dielectric member". The term "interconnect" may mean "interconnecting member". The term "provide" may mean "provide and/or form". The term "form" may mean "provide and/or form".

Unless explicitly described to the contrary, the word "comprise" and variations such as "comprises", "comprising", "include", or "including" may imply the inclusion of stated elements but not the exclusion of other elements.

Various embodiments, including methods and techniques, are described in this disclosure. Embodiments may also cover an article of manufacture that includes a non-transitory computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, embodiments may also cover apparatuses for practicing embodiments. Such apparatus may include circuits, dedicated and/or programmable, to carry out operations pertaining to embodiments. Examples of such apparatus include a general purpose computer and/or a dedicated computing device when appropriately programmed and may include a combination of a computer/computing device and dedicated/programmable hardware circuits (such as electrical, mechanical, and/or optical circuits) adapted for the various operations pertaining to embodiments.

FIG. 1 shows a schematic diagram (e.g., a schematic circuit diagram) that illustrates elements and/or structures in a signal receiver 100 in accordance with one or more embodiments. The signal receiver 100 may include a signal input terminal PAD for receiving an input signal from an external device. The signal input terminal PAD may be/include, for example, a conductive pad, a conductive wire, or an electrode.

The signal receiver 100 may include a first circuit 102, which may be electrically connected between a first power supply terminal 103 and a first node 104. The first circuit 102 may include a first p-channel metal-oxide-semiconductor (PMOS) transistor 112, an enable switch 122, a first protection switch 132, and a first transmission gate 105.

The enable switch 122 may be electrically connected between the first PMOS transistor 112 and the first power supply terminal 103. The first protection switch 132 may be electrically connected between the first node 104 and the first PMOS transistor 112.

A gate terminal of the first PMOS transistor 112 may be electrically connected through the first transmission gate 105 to the input terminal PAD. The enable switch 122 may receive a first enable signal IENH and may turn on or turn off according to the first enable signal IENH.

The first transmission gate 105 may clamp the voltage of a first copy of the input signal to generate a first clamped signal and may provide the first clamped signal to the gate terminal of the first PMOS transistor 112. The first transmission gate 105 may be/include a PMOS transistor. A control terminal (e.g., a gate terminal) of the first transmission gate 105 may receive a first reference voltage REFP.

The first protection switch 132 may be/include a PMOS transistor. The control terminal (e.g., a gate terminal) of the first protection switch 132 may receive the first reference voltage REFP.

The signal receiver 100 may include a second circuit 106, which may be electrically connected between a second power supply terminal 107 and the first node 104. The second circuit 106 may include a pull-down transistor 116, a first n-channel metal-oxide-semiconductor (NMOS) transistor 126, a second protection switch 136, and a second transmission gate 109. An output node 108 may be positioned between the first NMOS transistor 126 and the second protection switch 136. The first NMOS transistor 126 may be electrically connected between the output node 108 and the second power supply terminal 107. The second protection switch 136 may be electrically connected between the output node 108 and the first node 104. The pull-down transistor 116 may be electrically connected between the output node 108 and the second power supply terminal 107. The pull-down transistor 116 and the first NMOS transistor 126 may be electrically in parallel between the output node 108 and the second power supply terminal 107.

A gate terminal of the first NMOS transistor 126 may be electrically connected through the second transmission gate 109 to the input terminal PAD. The second transmission gate 109 may clamp the voltage of a second copy of the input signal to generate a second clamped signal and may provide the second clamped signal to the gate terminal of the first NMOS transistor 126. The second transmission gate 109 may be/include an NMOS transistor. A control terminal (e.g., a gate terminal) of the second transmission gate 109 may receive a second reference voltage REFN.

The second protection switch 136 may be/include an NMOS transistor. The control terminal (e.g., a gate terminal) of the second protection switch 136 may receive the second reference voltage REFN.

The pull-down transistor 116 may receive a second enable signal IENC and may turn on or turn off according to the second enable signal IENC. Logically, the second enable signal IENC may be analogous to or identical to the first enable signal IENH.

A first power voltage difference may be provided between the first power supply terminal 103 and the second power supply terminal 107. The first power supply terminal 103 may receive a first power supply voltage VDD33, e.g., 3.3 V. The second power supply terminal 107 may receive a second power supply voltage VSS. The second power supply terminal 107 may be electrically grounded, and the second power supply voltage VSS may be 0 V. The first power voltage difference may be 3.3 V.

A maximum allowable voltage of one or more of the devices (e.g., transistor) used for implementing the first transmission gate 105, the second transmission gate 109, the first PMOS transistor 112, the enable switch 122, the first protection switch 132, the first NMOS transistor 126, the pull-down transistor 116, and the second protection switch 136 may be less than the first power voltage difference. In some embodiments, the first power voltage difference may be about 3.3 V, and the maximum allowable voltage of each of the devices 105, 109, 112, 122, 132, 126, 116, and 136 may be less than or equal to 1.8 V.

Each of the difference between the first power supply voltage VDD33 and the first reference signal REFP and the difference between the second reference signal REFN and the second power supply voltage VSS is less than or equal to the maximum allowable voltage of each of the devices 105, 109, 112, 122, 132, 126, 116, and 136, such that satisfactory performance of each of the aforementioned devices may be ensured. The first power voltage difference may be 3.3 V, the first power supply voltage VDD33 may be 3.3 V, the first reference signal REFP may be 1.5 V, the second reference signal REFN may be 1.8 V, and the second power supply voltage VSS may be 0 V.

The maximum amplitude of the input signal (i.e., the difference between the maximum voltage of the input signal and the minimum voltage of the input signal) may be substantially equal to the first power voltage difference, e.g., 3.3 V.

Specific parameters of the transistors and/or the switches may be determined and/or configured according to embodiments.

Figure 5:
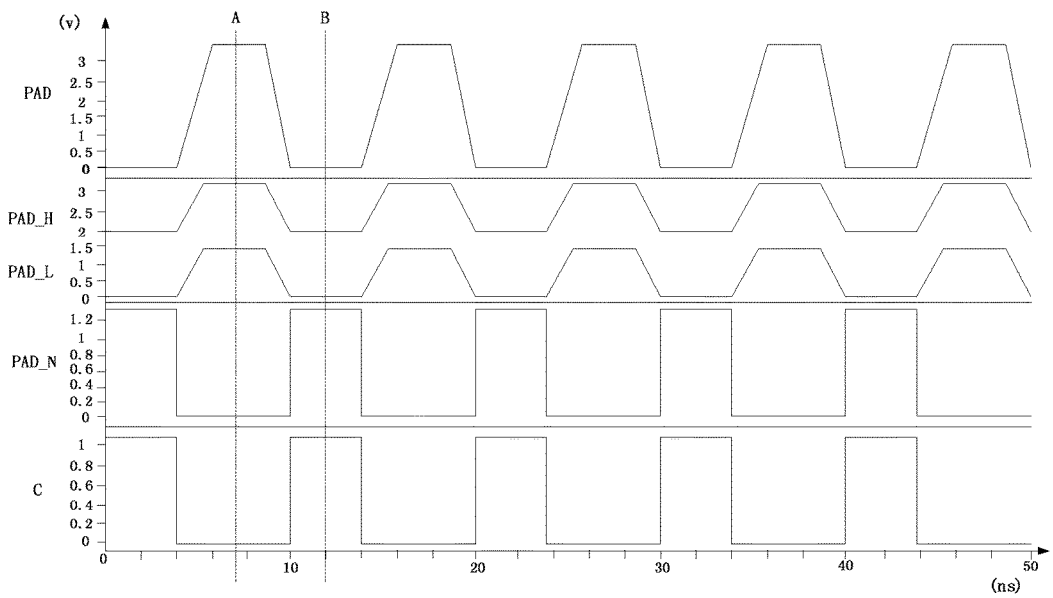
FIG. 5 shows schematic diagrams (e.g., schematic waveform diagrams) that illustrate examples of signals related to a method of operating a signal receiver in accordance with one or more embodiments.

An example of an operation method of the signal receiver 100 is discussed as follows with reference to FIG. 1 and FIG. 5. FIG. 5 shows schematic diagrams (e.g., schematic waveform diagrams) that illustrate examples of signals related to a method of operating the signal receiver 100 in accordance with one or more embodiments.

The input terminal PAD may receive an input signal from an external device. The voltage of the input signal may be in a range of 0 V to 3.3 V. The first enable signal IENH may be enabling, such that the enable switch 122 may be on (i.e., may be conductive). The second enable signal IENC may be disabling, such that the pull-down transistor may be off (i.e., may be insulating).

At the time A indicated in FIG. 5, the input signal received at the input terminal PAD may be 3.3 V, which may be a high voltage. The first enable signal IENH may be enabling and may enable the enable switch 112 to be on. The first reference REFP may enable the first transmission gate 105 to be on for transmitting a first copy of the high voltage to a section/node PAD_H, such that the voltage at the section/node PAD_H may be substantially equal to or only slightly less than the high voltage 3.3 V. The second transmission gate 109 may clamp a second copy of the high voltage input signal, such that the voltage at a section/node PAD_L may be substantially equal to or only slightly less than a clamped high voltage, e.g., 1.5 V.

At the time A indicated in FIG. 5, given that the section/node PAD_H is at the high voltage, the gate terminal of the first PMOS transistor 112 may receive the high voltage, such that the first PMOS transistor 112 may be off (regardless whether the enable switch 122 is turned on by the first enable signal IENH). Given that the section/node PAD_L is at the clamped high voltage, the gate terminal of the first NMOS transistor 126 may receive the clamped high voltage, such that the first NMOS transistor 126 may be on. As a result, the output node 108 may be at a low voltage (e.g., approximating 0 V), and a signal output terminal PAD_N may be at a low voltage (e.g., approximating 0 V).

At the time A indicated in FIG. 5, although the section/node PAD_H may be at a high voltage (e.g., 3.3 V), in the first PMOS transistor 112, the voltage differences between the gate terminal and the source terminal, between the gate terminal and the drain terminal, between the gate terminal and the body terminal, and between the source terminal and the drain terminal may be all less than or equal to the maximum allowable voltage of the first PMOS transistor 112. Therefore, the first PMOS transistor 112 may be safe and may operate normally and reliably. Although the section/node PAD_L may be at a high voltage (e.g., 1.5 V), in the first NMOS transistor 126, the voltage differences between the gate terminal and the source terminal, between the gate terminal and the drain terminal, between the gate terminal and the body terminal, and between the source terminal and the drain terminal may be all less than or equal to the maximum allowable voltage of the first NMOS transistor 126. Therefore, the first NMOS transistor 126 may be safe and may operate normally and reliably. Analogously, other devices in the signal receiver 100 may be safe and may operate reliably.

At the time B indicated in FIG. 5, the input signal received at the input terminal PAD may be at a low voltage, e.g., 0 V.

At the time B indicated in FIG. 5, the first enable signal may be enabling and may enable the enable switch 122 to be on. The first reference signal REFP may control the first transmission gate 105 to be on until the voltage at the section/node PAD_H may drop from the high voltage and may be clamped at its low voltage, which may approximate the voltage of the first reference signal REFP. For example, the voltage at the section/mode PAD_H may be substantially equal to the voltage of the first reference signal REFP plus the threshold voltage of the first transmission gate 105, or 2 V. Therefore, the gate terminal of the first PMOS transistor 112 may receive a low voltage, such that the first PMOS transistor 112 may be on. In the first protection switch 132, the gate-source voltage Vgs may be less than the threshold voltage Vth of the first protection switch 132, such that the first protection switch 132 may be on. The second transmission gate 109 may transmit a second copy of the input signal, which is at the low voltage, to the section/node PAD_L, such that the section/node PAD_L may be at its low voltage, e.g., 0 V. Therefore, the first circuit (including the first PMOS transistor 112, the enable switch 122, and the first protection switch 132) may be on, and the first NMOS transistor 126 may be off.

In the second protection switch 136, the gate-source voltage Vgs may be less than the threshold voltage Vth, such that the second protection switch 136 may be off. Therefore, the voltage at the output node 108 (and the voltage at the signal output terminal PAD_N) may be pulled up to a voltage substantially equal to the voltage of the second reference signal REFN minus the threshold voltage of the second protection switch 136, e.g., about 1.3 V. Subsequently, the second protection switch 136 may be turned off, such that the output node 108 (or the signal output terminal PAD_N) may remain at its high voltage, e.g., about 1.3 V. If the voltage at the output node 108 (or the signal output terminal PAD_N) drops from its high voltage, the drop may cause the second protection switch 136 to turn on, such that the output node 108 (or the signal output terminal PAD_N) may resume its high voltage and may maintain its high voltage.

Analogously, other devices of the signal receiver 100 may operate within safe voltage ranges.

If the first enable signal IENH is disabling and if the second enable signal is enabling, the enable switch 122 may be off, and the pull-down transistor 116 may be on. Therefore, the voltage at the node PAD_N (or the output node 108) may be pulled down to approximately 0 V.

According to embodiments, the output node 108 may be positioned (and electrically connected) between the first NMOS transistor 126 and the second protection switch 136. Therefore, the signal receiver 100 may not need additional devices (e.g., an additional transmission gate) to reduce the voltage at the output node 108. Advantageously, the circuit structure of the signal receiver 100 may be simplified, and the cost of the signal receiver 100 may be minimized.

The output node 108 may be electrically connected to a core circuit of an electronic device that includes the signal receiver 100. The core circuit may operate at a second power voltage difference, which may be lower than the first power voltage difference. As an example, the first power voltage difference may be about 3.3 V, and the second power voltage difference may be about 1.1 V.

Figure 2:
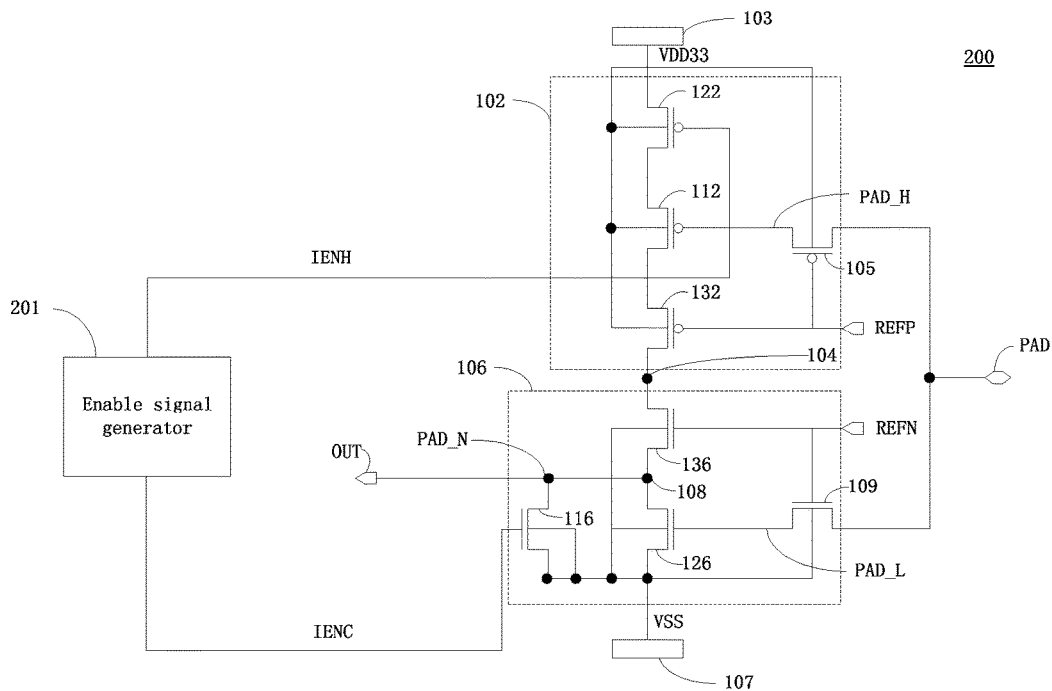
FIG. 2 shows a schematic diagram (e.g., a schematic circuit diagram) that illustrates elements and/or structures in a signal receiver in accordance with one or more embodiments.

FIG. 2 shows a schematic diagram (e.g., a schematic circuit diagram) that illustrates elements and/or structures in a signal receiver 200 in accordance with one or more embodiments. Some features of the signal receiver 200 may be analogous to or identical to some features described above with reference to FIG. 1 and FIG. 5. The signal receiver 200 may include an enable signal generator 201, which may generate the first enable signal IENH and the second enable signal IENC. The enable signal generator 201 may generate the first enable signal IENH and the second enable signal IENC based on a control signal received from a core circuit, which may be electrically connected to an output terminal OUT of the signal receiver 200. In an embodiment, the enable signal generator 201 may be/include a differential amplifier. A first input terminal of the enable signal generator 201 may receive a first copy of the control signal. A second terminal of the differential amplifier may receive an inverted signal of a second copy of the control signal. An output terminal of the differential amplifier may output the first enable signal IENH. In an embodiment, the enable signal generator 201 may be/include a level shifter. The level shifter may perform level shifting on the control signal to generate the first enable signal IENH. The enable signal generator 201 may provide a copy of the control signal or provide an inverted signal of a copy of the control signal as the second enable signal IENC for turning on or turning off the pull-down transistor 116. In an embodiment, the control signal may be a high voltage, and the enable signal generator 201 may include an inverter to provide an inverted signal of a copy of the control signal as the second enable signal IENC. In an embodiment, the control signal may be a low voltage, and the enable signal generator 201 may provide a copy of the control signal as the second enable signal IENC.

Figure 3:
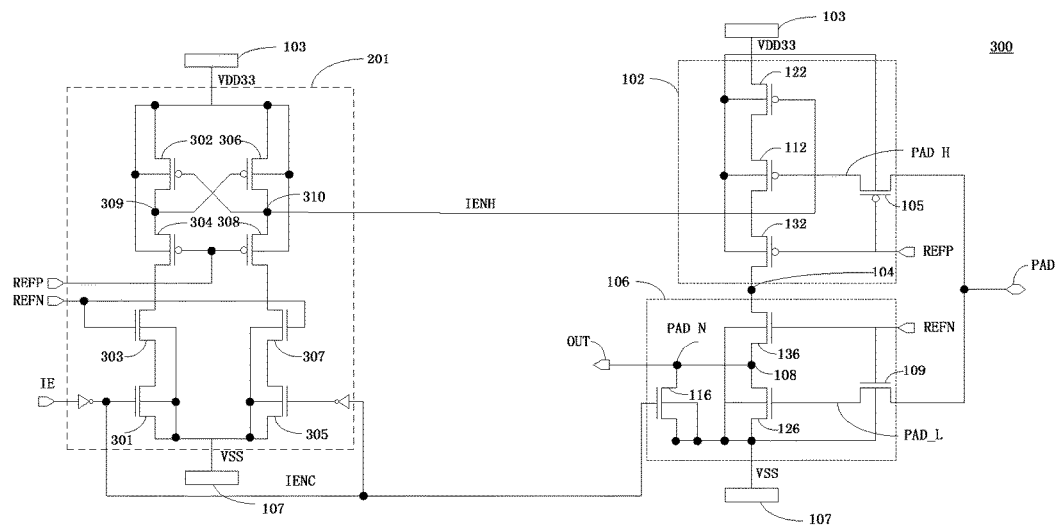
FIG. 3 shows a schematic diagram (e.g., a schematic circuit diagram) that illustrates elements and/or structures in a signal receiver in accordance with one or more embodiments.

FIG. 3 shows a schematic diagram (e.g., a schematic circuit diagram) that illustrates elements and/or structures in a signal receiver 300 in accordance with one or more embodiments. Some features of the signal receiver 300 may be analogous to or identical to some features described above with reference to one or more of FIG. 1, FIG. 2, and FIG. 5. In the signal receiver 300, the enable signal generator 201 may be/include a differential amplifier that includes a first sub-circuit (e.g., left sub-circuit) and a second sub-circuit (e.g., right sub-circuit).

The first sub-circuit (or left sub-circuit) may be electrically connected between the first power supply terminal 103 and the second power supply terminal 107. The first sub-circuit may include a second NMOS transistor 301 and a second PMOS transistor 302. A drain terminal of the second NMOS transistor 301 may be electrically connected through a third protection switch 303 and a fourth protection switch 304 to a second node 309. A source terminal of the second NMOS transistor 301 may be electrically connected to the second power supply terminal 107. A source terminal of the second PMOS transistor 302 may be electrically connected to the first power supply terminal 103. A drain terminal of the second PMOS transistor 302 may be electrically connected to the second node 309. The third protection switch 303 may be/include an NMOS transistor and may be controlled by a copy of the second reference signal REFN. The fourth protection switch 304 may be/include a PMOS transistor and may be controlled by a copy of the first reference signal REFP. In an embodiment, the first reference signal REFP may be 1.5 V, and the second reference signal REFN may be 1.8 V.

The second sub-circuit (or right sub-circuit) may be electrically connected between the first power supply terminal 103 and the second power supply terminal 107. The second sub-circuit may include a third NMOS transistor 305 and a third PMOS transistor 306. A drain terminal of the third NMOS transistor 305 may be electrically connected through a fifth protection switch 307 and a sixth protection switch 308 to a third node 310. A source terminal of the third NMOS transistor 305 may be electrically connected to the second power supply terminal 107. A source terminal of the third PMOS transistor 306 may be electrically connected to the first power supply terminal 103. A drain terminal of the third PMOS transistor 306 may be electrically connected to the third node 310. The fifth protection switch 307 may be/include an NMOS transistor and may be controlled by a copy of the second reference signal REFN. The sixth protection switch 308 may be/include a PMOS transistor and may be controlled by a copy of the first reference signal REFP. A gate terminal of the second PMOS transistor 302 may be electrically connected to the third node 310. A gate terminal of the third PMOS transistor 306 may be electrically connected to the second node 309. One of the second node 309 and the third node 310 may function as an output terminal for outputting the first enable signal IENH.

A control signal IE for the differential amplifier of the enable signal generator 201 may be provided by a core circuit of an electronic device that includes the signal receiver 300. A gate terminal of the second NMOS transistor 301 may function as an input terminal for receiving a copy of an inverted signal of the control signal IE. A gate terminal of the third NMOS transistor 305 may function as an input terminal for receiving a copy of the control signal IE, e.g., a twice inverted copy of the control signal IE. Accordingly, the third node 310 may function as an output terminal for outputting the first enable signal IENH, as illustrated in the example of FIG. 3. In an embodiment, the gate terminal of the second NMOS transistor 301 may function as an input terminal for receiving a copy of the control signal IE, e.g., a twice inverted copy of the control signal IE, the gate terminal of the third NMOS transistor 305 may function as an input terminal for receiving an inverted copy of the control signal IE, and the second node 309 may function as an output terminal for outputting the first enable signal IENH.

Referring to the example of FIG. 3, when the control signal IE is a high voltage, the second NMOS transistor 301 is off (i.e., insulating), while the third NMOS transistor 305, the fifth protection switch 307, and the sixth conduction switch 308 are on (i.e., conductive), such that the third node 310 may be pulled down to, for example, its low voltage, causing the third node 310 to output its low voltage as the first enable signal IENH. At the same time, an inverted copy of the control signal IE may be provided as the second enable signal IENC, such that the second enable signal IENC may also be a low voltage; therefore, the enable switch 112 may be on, and the pull-down transistor 116 may be off.

Referring to the example of FIG. 3, when the control signal IE is a low voltage, the third NMOS 305 may be off, while the second NMOS transistor 301, the third protection transistor 303, and the fourth protection switch 304 may be on, such that the second node 309 may be pulled down to, for example, its low voltage. Therefore, the third PMOS transistor 306 may be on, such that the third node 310 may be pulled up to, for example, its high voltage, causing the third node 310 to output its high voltage as the first enable signal IENH. At the same time, an inverted copy of the control signal IE may be provided as the second enable signal IENC, such that the second enable signal IENC may also be a high voltage; therefore, the enable switch 112 may be off, and the pull-down transistor 116 may be on.

Figure 4:
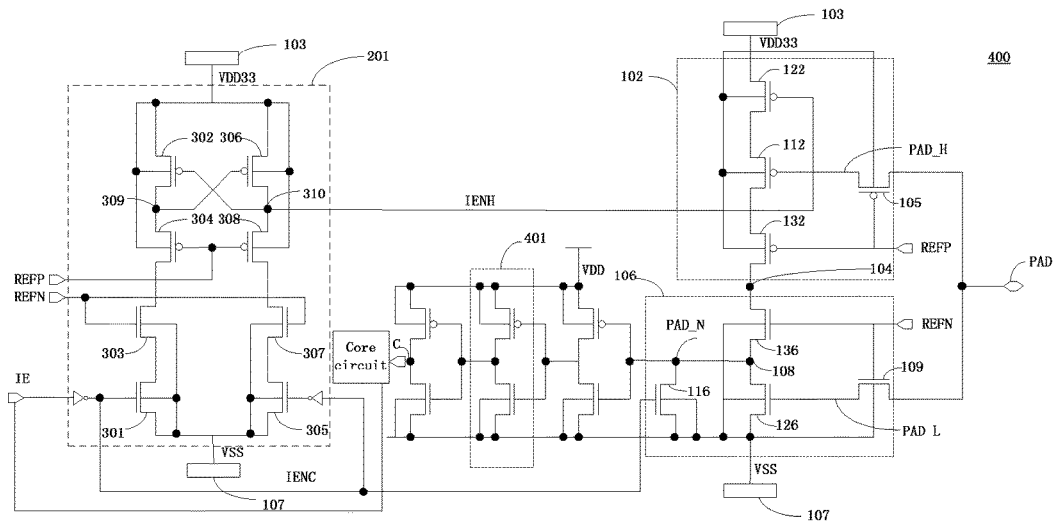
FIG. 4 shows a schematic diagram (e.g., a schematic circuit diagram) that illustrates elements and/or structures in a signal receiver in accordance with one or more embodiments.

FIG. 4 shows a schematic diagram (e.g., a schematic circuit diagram) that illustrates elements and/or structures in a signal receiver 400 in accordance with one or more embodiments. Some features of the signal receiver 400 may be analogous to or identical to some features described above with reference to one or more of FIG. 1, FIG. 2, FIG. 3, and FIG. 5. In addition to elements of the signal receiver 300, the signal receiver 400 may include one or more inverters 401, e.g., three inverters 401, which may be cascaded and may be electrically connected between an output node 108 and a core circuit of an electronic device that includes the signal receiver 400. The one or more inverters 401 may adjust/regulate (e.g., may clamp) the voltage of the output signal provided by the output node 108 to generate an adjusted/regulated signal (e.g., a clamped signal) at an output node C of the one or more inverters 401 and may provide the adjusted/regulated signal to the core circuit. The one or more inverters 401 may operate at a core power voltage difference, which may correspond to and/or substantially equal to the second power voltage difference, e.g., 1.1 V, and may be lower than the first power voltage difference, e.g., 3.3 V.

In one or more embodiments, one or more inverters 401 may be electrically connected between a core circuit and the signal receiver 100 or the signal receiver 200.

FIG. 5 shows schematic diagrams (e.g., schematic waveform diagrams) that illustrate examples of signals related to a method of operating one or more of the signal receivers 100, 200, 300, and 400 in accordance with one or more embodiments. Referring to FIG. 5, when the maximum value of the voltage of the input signal received at the input terminal PAD is 3.3 V, the maximum value of the output voltage at the signal output terminal PAD_N may be 1.3 V, and the maximum value of the voltage of adjusted/regulated signal provided at the output node C of the one or more inverters 401 may be about 1.1 V.

According to embodiments, although the maximum voltage of the input signal received by a signal receiver may be substantially high, the signal receiver may include components that are associated with substantially low allowable maximum voltage and have high operation speeds, and the components may operate effectively and reliably.

Figure 6:
FIG. 6 shows a schematic block diagram that illustrates elements in an electronic device in accordance with one or more embodiments.

FIG. 6 shows a schematic block diagram that illustrates elements in an electronic device, e.g., a signal processor, in accordance with one or more embodiments. The electronic device may include a core circuit and a signal receiver electrically connected to the core circuit. Some features of the core circuit and/or the signal receiver may be analogous to and/or identical to some features describe above with reference to one of more of FIG. 1, FIG. 2, FIG. 3, FIG. 4, and FIG. 5. The core circuit may process an adjusted signal provided by one or more inverters of the signal receiver and/or an output signal provided by an output node of the signal receiver. For example, the core circuit may be/include one or more of a processing unit, a digital signal processing circuit, a logic array, etc.

According to embodiments, components (e.g., transistors) in a signal receiver may be sufficiently protected, such that the signal receiver may reliably operate with a high power supply voltage and/or a high input signal voltage. Advantageously, an electronic device that includes the signal receiver may have satisfactory performance and/or may have a wide range of applications. According to embodiments, the structure of the signal receiver may be substantially simple. Advantageously, cost associated with implementing the signal receiver may be satisfactorily low.

While some embodiments have been described as examples, there are alterations, permutations, and equivalents. It should be noted that there are many alternative ways of implementing the methods and apparatuses. Furthermore, embodiments may find utility in other applications. The abstract section is provided herein for convenience and, due to word count limitation, is accordingly written for reading convenience and should not be employed to limit the scope of the claims. It is intended that the following appended claims be interpreted as including all alterations, permutations, and equivalents.

What is claimed is:

1. A signal receiver comprising:
a signal input terminal, which is configured to receive an input signal;
a first power supply terminal, which is configured to receive a first power supply voltage;
a second power supply terminal, which is configured to receive a second power supply voltage;
a signal output terminal, which is configured to output an output signal;
a first transmission gate, wherein a first terminal of the first transmission gate is electrically connected to the signal input terminal, and wherein a control electrode of the first transmission gate is configured to receive a first copy of a first reference voltage;
an enable switch, wherein a first terminal of the enable switch is electrically connected to the first power supply terminal, and wherein a control electrode of the enable switch is configured to receive a first enable signal;
a first p-channel transistor, wherein a first terminal of the first p-channel transistor is electrically connected to a second terminal of the enable switch, and wherein a gate electrode of the first p-channel transistor is electrically connected to a second terminal of the first transmission gate;
a first protection switch, wherein a first terminal of the first protection switch is electrically connected to a second terminal of the first p-channel transistor, and wherein a control electrode of the first protection switch is configured to receive a second copy of the first reference voltage;
a second transmission gate, wherein a first terminal of the second transmission gate is electrically connected to the signal input terminal, and wherein a control electrode of the second transmission gate is configured to receive a first copy of a second reference voltage;
a first n-channel transistor, wherein a first terminal of the first n-channel transistor is electrically connected to the second power supply terminal, wherein a second terminal of the first n-channel transistor is electrically connected to the signal output terminal, and wherein a gate electrode of the first n-channel transistor is electrically connected to a second terminal of the second transmission gate;
a second protection switch, wherein a first terminal of the second protection switch is electrically connected to each of the signal output terminal and the second terminal of the first n-channel transistor, wherein a second terminal of the second protection switch is electrically connected to a second terminal of the first protection switch, and wherein a control electrode of the second protection switch is configured to receive a second copy of the second reference voltage; and
a pull-down transistor, wherein a first terminal of the pull-down transistor is electrically connected to each of the second power supply terminal and the first terminal of the first n-channel transistor, wherein a second terminal of the pull-down transistor is electrically connected through no transistor to each of the signal output terminal and the second terminal of the first n-channel transistor, wherein a gate electrode of the pull-down transistor is configured to receive a second enable signal, and wherein the signal output terminal is configured to output the output signal to a circuit external to all of the first n-channel transistor, the second protection switch, and the pull-down transistor.

2. The signal receiver of claim 1, wherein the first power supply terminal and the second power terminal are configured to provide a first power voltage difference, and wherein one or more of a maximum allowable voltage of the first transmission gate, a maximum allowable voltage of the enable switch, a maximum allowable voltage of the first p-channel transistor, a maximum allowable voltage of the first protection switch, a maximum allowable voltage of the second transmission gate, a maximum allowable voltage of the first n-channel transistor, a maximum allowable voltage of the second protection switch, and a maximum allowable voltage of the pull-down switch is less than the first power voltage difference.

3. The signal receiver of claim 1 comprising: an enable signal generator, which is configured to generate the first enable signal and the second enable signal, wherein the first enable signal is at a first level if the second enable signal is at a second level, wherein the first enable signal is at a third level if the second enable signal is at a fourth level, wherein the first level is higher than the third level, and wherein the second level is higher than the fourth level.

4. The signal receiver of claim 1 comprising: an enable signal generator, which comprises a differential amplifier and is configured to generate the first enable signal and the second enable signal, wherein the differential amplifier comprises a first input terminal and a second input terminal, wherein the first input terminal is configured to receive an inverted copy of a control signal, and wherein the second input terminal is configured to receive a copy of the control signal.

5. The signal receiver of claim 1 comprising:
a first enable signal node, which is configured to provide the first enable signal;
a second n-channel transistor, wherein a first terminal of the second n-channel transistor is electrically connected to the second power supply terminal, and wherein a gate electrode of the second n-channel transistor is configured to receive an inverted copy of a control signal;
a second p-channel transistor, wherein a first terminal of the second p-channel transistor is electrically connected to the first power supply terminal, wherein a second terminal of the second p-channel transistor is electrically connected to a second terminal of the second n-channel transistor, and wherein a gate electrode of the second p-channel transistor is electrically connected to the first enable signal node;
a third n-channel transistor, wherein a first terminal of the third n-channel transistor is electrically connected to the second power supply terminal, wherein a second terminal of the third n-channel transistor is electrically connected through the first enable signal node to the gate electrode of the second p-channel transistor, and wherein a gate electrode of the third n-channel transistor is configured to receive a copy of the control signal; and a third p-channel transistor, wherein a first terminal of the third p-channel transistor is electrically connected to the first power supply terminal, wherein a second terminal of the third p-channel transistor is electrically connected through the first enable signal node to the second terminal of the third n-channel transistor, and wherein a gate electrode of the third p-channel transistor is electrically connected to each of the second terminal of the second n-channel transistor and the second terminal of the second p-channel transistor.

6. The signal receiver of claim 5 comprising: a third protection switch, wherein a first terminal of the third protection switch is electrically connected to the second terminal of the second n-channel transistor, wherein a second terminal of the third protection switch is electrically connected to the second terminal of the second p-channel transistor, and wherein a control electrode of the third protection switch is configured to receive a third copy of the second reference signal.

7. The signal receiver of claim 6 comprising: a fourth protection switch, wherein a first terminal of the fourth protection switch is electrically connected to the second terminal of the third protection switch, wherein a second terminal of the fourth protection switch is electrically connected to the second terminal of the second p-channel transistor, and wherein a control electrode of the fourth protection switch is configured to receive a third copy of the first reference signal.

8. The signal receiver of claim 7 comprising: a fifth protection switch, wherein a first terminal of the fifth protection switch is electrically connected to the second terminal of the third n-channel transistor, wherein a second terminal of the fifth protection switch is electrically connected through the first enable signal node to the second terminal of the third p-channel transistor, and wherein a control electrode of the fifth protection switch is configured to receive a fourth copy of the second reference signal.

9. The signal receiver of claim 8 comprising: a sixth protection switch, wherein a first terminal of the sixth protection switch is electrically connected to the second terminal of the third n-channel transistor, wherein a second terminal of the sixth protection switch is electrically connected through the first enable signal node to the second terminal of the third p-channel transistor, and wherein a control electrode of the sixth protection switch is configured to receive a fourth copy of the first reference signal.

10. The signal receiver of claim 1 comprising: an inverter or a plurality of inverters, wherein the inverters are cascaded, and wherein an input node of the inverter or an input node of the plurality of inverters is electrically connected to the signal output terminal.

11. A method of operating a signal receiver, the method comprising:

providing an input signal to a signal input terminal of the signal receiver;

providing a first power supply voltage to a first power supply terminal of the signal receiver;

providing a second power supply voltage to a second power supply terminal of the signal receiver;

providing a first copy of a first reference voltage to a control electrode of a first transmission gate of the signal receiver, wherein a first terminal of the first transmission gate is electrically connected to the signal input terminal;

providing a first enable signal to a control electrode of an enable switch of the signal receiver, wherein a first terminal of the enable switch is electrically connected to the first power supply terminal, wherein a first terminal of a first p-channel transistor of the signal receiver is electrically connected to a second terminal of the enable switch, and wherein a gate electrode of the first p-channel transistor is electrically connected to a second terminal of the first transmission gate;

providing a second copy of the first reference voltage to a control electrode of a first protection switch of the signal receiver, wherein a first terminal of the first protection switch is electrically connected to a second terminal of the first p-channel transistor;

providing a first copy of a second reference voltage to a control electrode of a second transmission gate of the signal receiver, wherein a first terminal of the second transmission gate is electrically connected to the signal input terminal, wherein a first terminal of a first n-channel transistor of the signal receiver is electrically connected to the second power supply terminal, wherein a second terminal of the first n-channel transistor is electrically connected to a signal output terminal, and wherein a gate electrode of the first n-channel transistor is electrically connected to a second terminal of the second transmission gate;

providing a second copy of the second reference voltage to a control electrode of a second protection switch of the signal receiver, wherein a first terminal of the second protection switch is electrically connected to each of the signal output terminal and the second terminal of the first n-channel transistor, and wherein a second terminal of the second protection switch is electrically connected to a second terminal of the first protection switch;

providing a second enable signal to a gate electrode of a pull-down transistor of the signal receiver, wherein a first terminal of the pull-down transistor is electrically connected to each of the second power supply terminal and the first terminal of the first n-channel transistor, and wherein a second terminal of the pull-down transistor is electrically connected through no transistor to each of the signal output terminal and the second terminal of the first n-channel transistor; and using the signal output terminal to provide an output signal to a circuit external to all of the first n-channel transistor, the second protection switch, and the pull-down transistor.

12. The method of claim 11 comprising:

providing a first power voltage difference between the first power supply terminal and the second power terminal, wherein the power voltage difference is higher than one or more of a maximum allowable voltage of the first transmission gate, a maximum allowable voltage of the enable switch, a maximum allowable voltage of the first p-channel transistor, a maximum allowable voltage of the first protection switch, a maximum allowable voltage of the second transmission gate, a maximum allowable voltage of the first n-channel transistor, a maximum allowable voltage of the second protection switch, and a maximum allowable voltage of the pull-down switch.

13. The method of claim 11, wherein the first enable signal is at a first level if the second enable signal is at a second level, wherein the first enable signal is at a third level if the second enable signal is at a fourth level, wherein the first level is higher than the third level, and wherein the second level is higher than the fourth level.

14. An electronic device comprising:
- a signal input terminal, which is configured to receive an input signal;
- a first power supply terminal, which is configured to receive a first power supply voltage;
- a second power supply terminal, which is configured to receive a second power supply voltage;
- a signal output terminal, which is configured to output an output signal;
- a first transmission gate, wherein a first terminal of the first transmission gate is electrically connected to the signal input terminal, and wherein a control electrode of the first transmission gate is configured to receive a first copy of a first reference voltage;
- an enable switch, wherein a first terminal of the enable switch is electrically connected to the first power supply terminal, and wherein a control electrode of the enable switch is configured to receive a first enable signal;
- a first p-channel transistor, wherein a first terminal of the first p-channel transistor is electrically connected to a second terminal of the enable switch, and wherein a gate electrode of the first p-channel transistor is electrically connected to a second terminal of the first transmission gate;
- a first protection switch, wherein a first terminal of the first protection switch is electrically connected to a second terminal of the first p-channel transistor, and wherein a control electrode of the first protection switch is configured to receive a second copy of the first reference voltage;
- a second transmission gate, wherein a first terminal of the second transmission gate is electrically connected to the signal input terminal, and wherein a control electrode of the second transmission gate is configured to receive a first copy of a second reference voltage;
- a first n-channel transistor, wherein a first terminal of the first n-channel transistor is electrically connected to the second power supply terminal, wherein a second terminal of the first n-channel transistor is electrically connected to the signal output terminal, and wherein a gate electrode of the first n-channel transistor is electrically connected to a second terminal of the second transmission gate;
- a second protection switch, wherein a first terminal of the second protection switch is electrically connected to each of the signal output terminal and the second terminal of the first n-channel transistor, wherein a second terminal of the second protection switch is electrically connected to a second terminal of the first protection switch, and wherein a control electrode of the second protection switch is configured to receive a second copy of the second reference voltage;
- a pull-down transistor, wherein a first terminal of the pull-down transistor is electrically connected to each of the second power supply terminal and the first terminal of the first n-channel transistor, wherein a second terminal of the pull-down transistor is electrically connected to each of the signal output terminal and the second terminal of the first n-channel transistor, and wherein a gate electrode of the pull-down transistor is configured to receive a second enable signal;
- an enable signal generator, which comprises a differential amplifier and is configured to generate the first enable signal and the second enable signal, wherein the differential amplifier comprises a first input terminal and a second input terminal, wherein the first input terminal is configured to receive an inverted copy of a control signal, and wherein the second input terminal is configured to receive a copy of the control signal; and
- a core circuit, which is configured to provide the control signal and is configured to receive one or more of the output signal and an adjusted signal generated based on the output signal.

15. The electronic device of claim 14 comprising: a plurality of inverters, which is configured to receive the output signal and is configured to provide the adjusted signal, wherein the inverters are cascaded and comprise a first inverter and a second inverter, wherein the first inverter is configured to receive the output signal from the signal output terminal, and wherein the second inverter is configured to provide the adjusted signal to the core circuit.

* * * * *